(12) United States Patent
Cole et al.

(10) Patent No.: US 10,750,627 B2
(45) Date of Patent: Aug. 18, 2020

(54) HIGH VOLTAGE POWER MODULE

(71) Applicant: Cree Fayetteville, Inc., Fayetteville, AR (US)

(72) Inventors: Zachary Cole, Summers, AR (US); Brandon Passmore, Fayetteville, AR (US)

(73) Assignee: Cree Fayetteville, Inc., Fayetteville, AR (US)

( * ) Notice: Subject to any disclaimer, the term of this patent is extended or adjusted under 35 U.S.C. 154(b) by 0 days.

(21) Appl. No.: 16/360,333

(22) Filed: Mar. 21, 2019

(65) Prior Publication Data

US 2020/0053890 A1 Feb. 13, 2020

Related U.S. Application Data

(60) Continuation of application No. 15/796,138, filed on Oct. 27, 2017, now Pat. No. 10,448,524, which is a
(Continued)

(51) Int. Cl.
*H05K 5/00* (2006.01)
*H01L 25/11* (2006.01)
(Continued)

(52) U.S. Cl.
CPC ....... *H05K 5/0065* (2013.01); *H01L 23/5382* (2013.01); *H01L 25/115* (2013.01);
(Continued)

(58) Field of Classification Search
CPC .. H05K 5/0065; H05K 5/0069; H05K 23/538; H05K 23/5381; H05K 23/5382; H05K 25/162
See application file for complete search history.

(56) References Cited

U.S. PATENT DOCUMENTS 5,347,158 A 9/1994 Matsuda et al.
5,466,974 A 11/1995 Sutrina et al.
(Continued)

FOREIGN PATENT DOCUMENTS

WO 2014090686 A1 6/2014

OTHER PUBLICATIONS

Bhattacharya, Subhashish, "15 kV SiC-IGBT Modules for Grid Scale Power Conversion," DE-AR0000110, Feb. 8, 2010, U.S. Department of Energy ARPA-E ADEPT Program, 15 pages.
(Continued)

*Primary Examiner* — Hoa C Nguyen
(74) *Attorney, Agent, or Firm* — Withrow & Terranova, P.L.L.C.

(57) ABSTRACT

A power module includes a number of sub-modules connected via removable jumpers. The removable jumpers allow the connections between one or more power semiconductor die in the sub-modules to be reconfigured, such that when the removable jumpers are provided, the power module has a first function, and when the removable jumpers are removed, the power module has a second function. The removable jumpers may also allow for independent testing of the sub-modules. The power module may also include a multi-layer printed circuit board (PCB), which is used to connect one or more contacts of the power semiconductor die. The multi-layer PCB reduces stray inductance between the contacts and therefore improves the performance of the power module.

31 Claims, 9 Drawing Sheets

Related U.S. Application Data division of application No. 14/918,110, filed on Oct. 20, 2015, now Pat. No. 9,839,146.

(51) Int. Cl.

| | |
|---|---|
| *H01L 25/16* | (2006.01) |
| *H01L 23/538* | (2006.01) |
| *H01L 29/16* | (2006.01) |
| *H01L 29/78* | (2006.01) |
| *H05K 1/02* | (2006.01) |
| *H01L 23/40* | (2006.01) |
| *H02M 7/00* | (2006.01) |
| *H02M 1/088* | (2006.01) |
| *H01L 25/07* | (2006.01) |

(52) U.S. Cl.
CPC ........ *H01L 25/162* (2013.01); *H01L 29/1608* (2013.01); *H01L 29/78* (2013.01); *H05K 1/0298* (2013.01); *H05K 5/0069* (2013.01); *H01L 23/4093* (2013.01); *H01L 25/072* (2013.01); *H01L 2224/49111* (2013.01); *H02M 1/088* (2013.01); *H02M 7/003* (2013.01); *H05K 2201/10166* (2013.01)

(56) References Cited

U.S. PATENT DOCUMENTS

| | | | |
|---|---|---|---|
| 5,471,089 | A | 11/1995 | Nagatomo et al. |
| 5,705,775 | A | 1/1998 | Ishihara et al. |
| 5,835,356 | A | 11/1998 | Wieloch et al. |
| 6,000,034 | A | 12/1999 | Lightbody et al. |
| 6,307,755 | B1 | 10/2001 | Williams et al. |
| 6,400,577 | B1 | 6/2002 | Goodwin et al. |
| 7,687,903 | B2 | 3/2010 | Son et al. |
| 7,786,486 | B2 | 8/2010 | Casey et al. |
| 8,018,056 | B2 | 9/2011 | Hauenstein |
| 8,368,210 | B2 | 2/2013 | Hauenstein |
| 8,410,720 | B2 | 4/2013 | Holec et al. |
| 9,373,617 | B2 | 6/2016 | Das et al. |
| 9,426,883 | B2 | 8/2016 | McPherson et al. |
| 9,673,283 | B2 | 6/2017 | Henning et al. |
| D821,306 | S | 6/2018 | Liu et al. |
| 10,028,400 | B2 | 7/2018 | Soyano |
| 10,091,898 | B2 | 10/2018 | Jeong |
| D839,184 | S | 1/2019 | Li |
| 10,312,227 | B2 | 6/2019 | Nakashima et al. |
| 10,345,864 | B1 | 7/2019 | Ramirez et al. |
| 10,347,608 | B2 | 7/2019 | Rowden et al. |
| 10,517,181 | B2 | 12/2019 | Kaneko et al. |
| D872,021 | S | 1/2020 | Xu |
| 2004/0252462 | A1 | 12/2004 | Cromwell et al. |
| 2005/0161797 | A1 | 7/2005 | Miller |
| 2005/0174744 | A1 | 8/2005 | Zheng |
| 2006/0126318 | A1 | 6/2006 | Mechi |
| 2008/0098895 | A1 | 5/2008 | Sato et al. |
| 2009/0004547 | A1 | 1/2009 | Vitella et al. |
| 2009/0021895 | A1 | 1/2009 | Purves et al. |
| 2010/0284155 | A1 | 11/2010 | Stolze et al. |
| 2011/0011633 | A1 | 1/2011 | Uchida et al. |
| 2011/0193491 | A1 | 8/2011 | Choutov et al. |
| 2011/0210568 | A1 | 9/2011 | Williams |
| 2011/0221268 | A1 | 9/2011 | Kanazawa et al. |
| 2011/0222244 | A1 | 9/2011 | Takashiro et al. |
| 2012/0299661 | A1* | 11/2012 | Williams .............. H03F 1/0227 330/296 |
| 2013/0062751 | A1 | 3/2013 | Takagi et al. |
| 2013/0063184 | A1 | 3/2013 | Liang et al. |
| 2013/0164567 | A1 | 6/2013 | Olsson et al. |
| 2013/0188397 | A1 | 7/2013 | Wu et al. |
| 2013/0248883 | A1 | 9/2013 | Das et al. |
| 2013/0285234 | A1 | 10/2013 | Uhlemann et al. |
| 2014/0097501 | A1* | 4/2014 | Guo ..................... H01L 25/072 257/379 |
| 2014/0183550 | A1 | 7/2014 | Reusch et al. |
| 2014/0284155 | A1 | 9/2014 | Zhang et al. |
| 2015/0131236 | A1 | 5/2015 | Passmore et al. |
| 2015/0138858 | A1* | 5/2015 | Kusama ................ H02M 7/537 363/123 |
| 2015/0189784 | A1 | 7/2015 | Hirano et al. |
| 2015/0216067 | A1 | 7/2015 | McPherson et al. |
| 2015/0303806 | A1* | 10/2015 | Madsen .............. H02M 7/5383 323/271 |
| 2016/0043711 | A1* | 2/2016 | Cyr ...................... H03K 17/082 318/400.22 |
| 2017/0112005 | A1 | 4/2017 | Cole et al. |
| 2018/0070462 | A1 | 3/2018 | Cole et al. |

OTHER PUBLICATIONS

Li, Shengnan, "Packaging Design of IGBT Power Module Using Novel Switching Cells," Doctoral Dissertations, University of Tennessee, Graduate School of Trace: Tennessee Research and Creative Exchange, Dec. 2011, trace.tennessee.edu/utk_graddiss/1205/, 125 pages.

Ulrich, Richard, K., et al., "Chapter 6 Electrical Considerations, Modeling, and Simulation," in Advanced Electronic Packaging (book), Second Edition, Feb. 2006, Wiley-IEEE Press, pp. 194-205.

Wade, Neal, et al., "Energy Storage for Power Flow Management and Voltage Control on an 11kV UK Distribution Network," 20th International Conference and Exhibition on Electricity Distribution (CIRED), Session 4, Paper 0824, Jun. 8-11, 2009, Prague, Czech Republic, IET, 4 pages.

Non-Final Office Action for U.S. Appl. No. 14/918,110, dated Apr. 19, 2017, 13 pages.

Notice of Allowance for U.S. Appl. No. 14/918,110, dated Aug. 10, 2017, 7 pages.

Invitation to Pay Additional Fees and Partial International Search for International Patent Application No. PCT/US2016/046780, dated Apr. 12, 2017, 8 pages.

International Search Report and Written Opinion for International Patent Application No. PCT/US2016/046780, dated Jun. 6, 2017, 19 pages.

Non-Final Office Action for U.S. Appl. No. 14/516,700, dated Jun. 29, 2016, 12 pages.

Final Office Action for U.S. Appl. No. 14/516,700, dated Dec. 15, 2016, 14 pages.

Advisory Action for U.S. Appl. No. 14/516,700, dated Mar. 17, 2017, 3 pages.

Advisory Action for U.S. Appl. No. 14/516,700, dated Mar. 29, 2017, 3 pages.

Non-Final Office Action for U.S. Appl. No. 14/516,700, dated Aug. 17, 2017, 14 pages.

International Search Report and Written Opinion for International Patent Application No. PCT/US2014/061109, dated Jan. 19, 2015, 8 pages.

International Preliminary Report on Patentability for International Patent Application No. PCT/US2014/061109, dated Apr. 28, 2016, 7 pages.

International Preliminary Report on Patentability for International Patent Application No. PCT/US2016/046780, dated May 3, 2018, 12 pages.

Notice of Allowance for U.S. Appl. No. 14/516,700, dated Mar. 21, 2018, 9 pages.

Non-Final Office Action for U.S. Appl. No. 15/796,138, dated Oct. 3, 2018, 9 pages.

Final Office Action for U.S. Appl. No. 15/796,138, dated Feb. 14, 2019, 11 pages.

Notice of Allowance, Examiner-Initiated Interview Summary, and AFCP 2.0 Decision for U.S. Appl. No. 15/796,138, dated Apr. 29, 2019, 10 pages.

Notice of Reason for Rejection for Japanese Patent Application No. 2018-520549, dated Mar. 4, 2019, 8 pages.

First Office Action for Chinese Patent Application No. 2016800744019, dated Sep. 3, 2019, 17 pages.

Decision to Grant a Patent for Japanese Patent Application No. 2018-520549, dated Aug. 20, 2019, 8 pages.

(56) References Cited

OTHER PUBLICATIONS

Office Action for German Patent Application No. 11 2014 004 770.8, dated Jul. 8, 2019, 7 pages.
Author Unknown, "CAS300M12BM2: 1200-V, 300-A, Silicon Carbide, 62-mm, Half-Bridge Module," retrieved Jan. 8, 2020 from https://www.wolfspeed.com/cas300m12bm2, 6 pages.
Dvorak, P., "Wolfspeed's First Commercial Product Redifines High-Current Power Density, Efficiency, and Performance," May 11, 2016, available at https://www.windpowerengineering.com/wolfspeedsfirstommercialproductredifineshighcurrentpowerdensityefficiencyperformance/, 5 pages.
Lemmon, A., "Professor Receives Young Investigator Program Award from U.S. Navy," May 24, 2018, The University of Alabama, available at https://www.ua.edu/news/2018/05/professor-receives-young-investigator-program-award-from-u-s-navy/, 4 pages.
Restriction Requirement for U.S. Appl. No. 29/663,505, dated Feb. 3, 2019, 5 pages.
Second Office Action for Chinese Patent Application No. 201680074401, dated Mar. 10, 2020, 10 pages.
Examination Report for European Patent Application No. 16840302.0, dated Mar. 5, 2020, 6 pages.
Non-Final Office Action for U.S. Appl. No. 29/663,505, dated May 12, 2020, 8 pages.

* cited by examiner

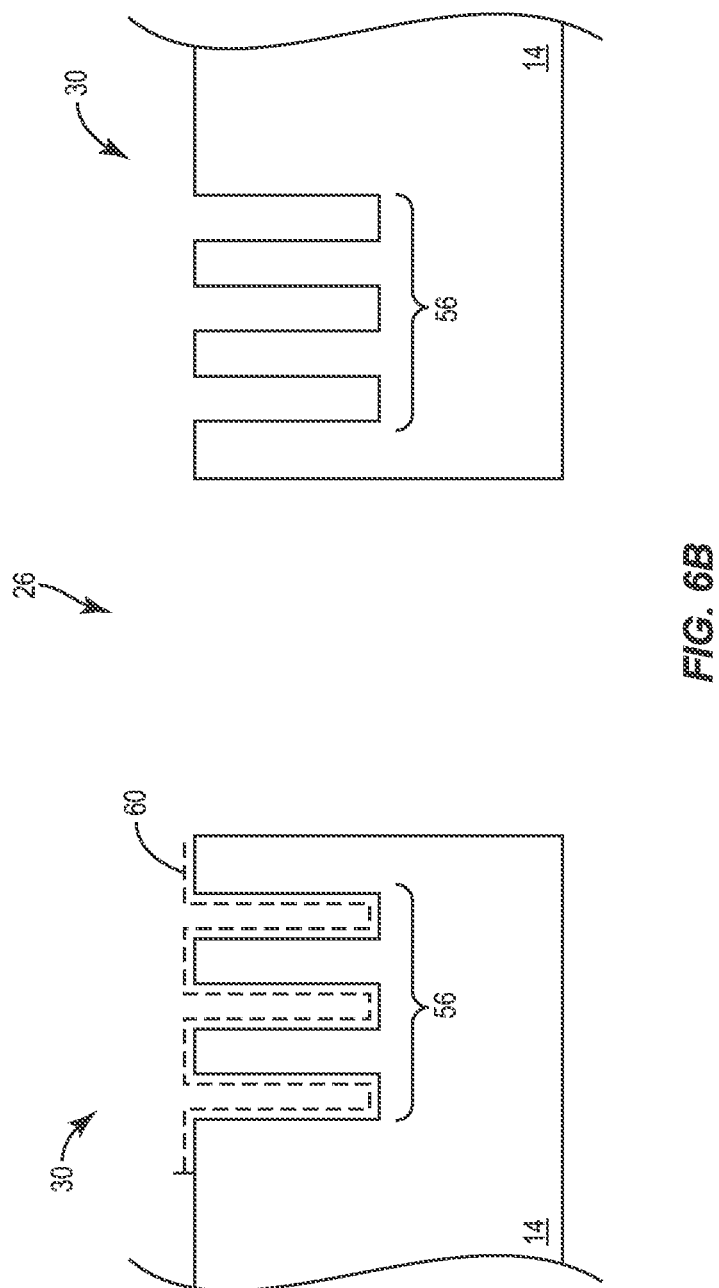

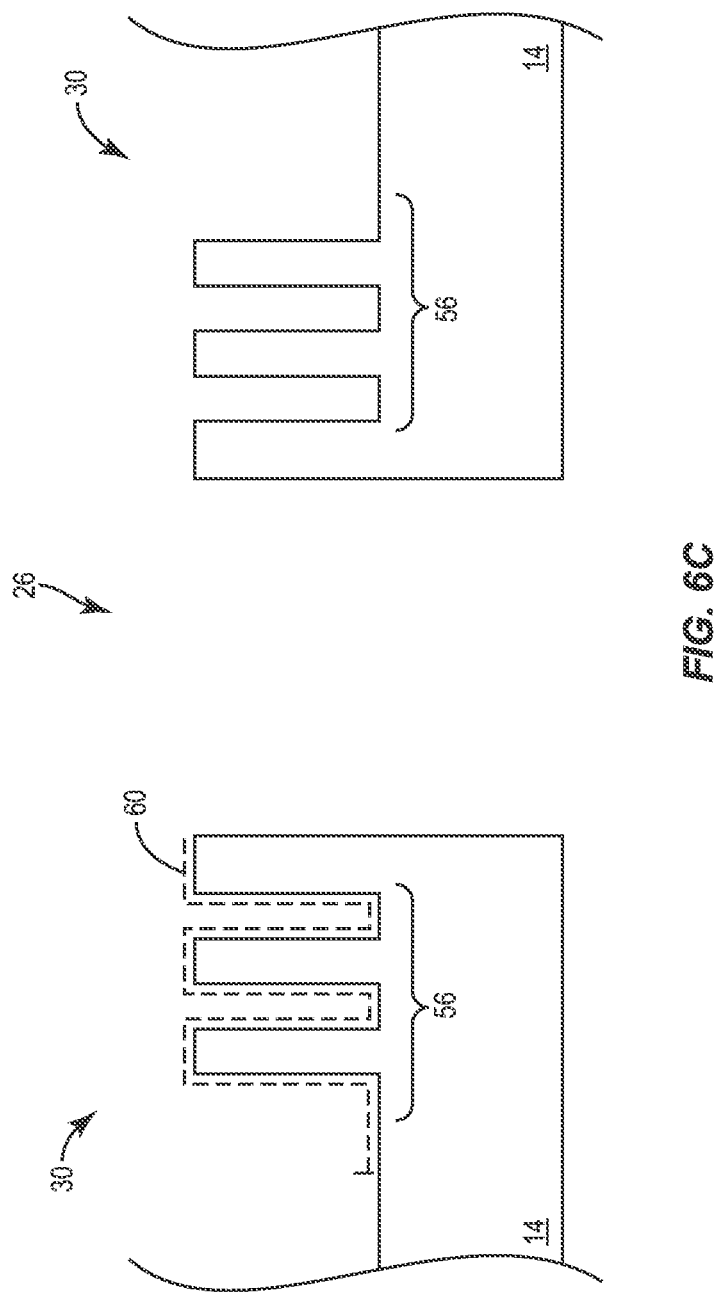

US 10,750,627 B2

HIGH VOLTAGE POWER MODULE

RELATED APPLICATIONS

This application is a continuation of U.S. patent application Ser. No. 15/796,138, filed Oct. 27, 2017, now U.S. Pat. No. 10,448,524, which is a divisional application of U.S. patent application Ser. No. 14/918,110, filed Oct. 20, 2015, now U.S. Pat. No. 9,839,146, the disclosures of which are hereby incorporated herein by reference in their entireties.

GOVERNMENT SUPPORT

This invention was made with government funds under contract number N00014-15-C-0051 awarded by the Office of Naval Research. The U.S. Government has certain rights in this invention.

FIELD OF THE DISCLOSURE

The present disclosure relates to power modules, and specifically to high voltage, high frequency power modules.

BACKGROUND

Power modules are standalone devices that may perform a variety of functions in a power converter system. For example, power modules may include any number of switching components necessary to form boost converters, buck converters, half-bridge converters, full-bridge converters, or any portion thereof. Conventional power modules have generally used power converter circuitry with silicon (Si) switching components. While effective in many applications, using power converter circuitry with silicon switching components generally limits the switching frequency at which the power converter circuitry can operate. This in turn necessitates the use of larger magnetic components, which may drive up the cost of a power converter system. Further, the efficiency of silicon switching components is limited, which may result in unnecessary energy expenditure in the power converter system.

Conventional power modules are generally single-purpose devices that do not lend themselves to repair or re-working. A conventional power module may include a number of power semiconductor die that are permanently attached to a power substrate and connected as desired to one or more electrical connectors. Due to the permanent nature of the connections to the power semiconductor die, conventional power modules can usually only be used for a single specific function for which they were designed (e.g., in a boost converter, a buck converter, a half-bridge converter, or a full-bridge converter). Further, if one of the power semiconductor die fails, the entire conventional power module usually must be replaced.

A number of important performance metrics of a power module (e.g., gate control loop inductance and power loop inductance) are determined by the layout of the power semiconductor die and the routing between the contacts thereof and one or more electrical contacts. While improvements to these aspects of power modules are continually evolving, there is significant room for improvement.

SUMMARY

In light of the above, there is a need for a power module with improved performance. Specifically, there is a need for a power module that is repairable and re-workable. Further, there is a need for a power module capable of operating at high switching speeds and providing high efficiency. Finally, there is a need for a power module with improvements to the layout and connection paths thereof.

In one embodiment, a power module includes a first sub-module and a second sub-module. The first sub-module includes at least a first power semiconductor die. The second sub-module includes at least a second power semiconductor die. A removable jumper is coupled between at least one contact of the first power semiconductor die and at least one contact of the second power semiconductor die, such that when the removable jumper is provided the power module is configured to provide a first function, and when the removable jumper is removed the power module is configured to provide a second function. Connecting the first power semiconductor die and the second power semiconductor die via the removable jumper allows the power module to be reconfigured, such that the power module is capable of performing a variety of functions in a power converter system. Further, connecting the first power semiconductor die and the second power semiconductor die via the removable jumper allows the first sub-module and the second sub-module to be independently tested.

In one embodiment, the first sub-module and the second sub-module are independently removable from the power module. Accordingly, in the event of a failure of one or more components in either the first sub-module or the second sub-module, the particular sub-module may be replaced rather than replacing the entire power module.

In one embodiment, the power module includes a third sub-module, which in turn includes a third power semiconductor die. An additional removable jumper couples at least one contact of the third power semiconductor die to the at least one contact of the second power semiconductor die. When the removable jumper and the additional removable jumper are provided, the power module is configured to operate in a single-phase mode of operation. When the removable jumper and the additional removable jumper are removed, the power module is configured to operate in a three-phase mode of operation. Using the removable jumper and the additional removable jumper to connect the first power semiconductor die, the second power semiconductor die, and the third power semiconductor die allows the power module to operate in multiple modes of operation and therefore perform a variety of functions. Further, connecting the first power semiconductor die, the second power semiconductor die, and the third power semiconductor die via the removable jumper and the additional removable jumper allows the first sub-module, the second sub-module, and the third sub-module to be independently tested.

In one embodiment, a power module includes a first power semiconductor die, a second power semiconductor die, and a multi-layer printed circuit board (PCB) coupled between the first power semiconductor die and the second power semiconductor die. In particular, the first power semiconductor die and the second power semiconductor die each include a first contact and a second contact. The first contact of the first power semiconductor die and the first contact of the second semiconductor die are coupled together via a first conductive layer of the multi-layer PCB. The second contact of the first power semiconductor die and the second contact of the second power semiconductor die are coupled together via a second conductive layer of the multi-layer PCB, which is separated from the first conductive layer by an insulating layer. The first conductive layer may be coupled to a first electrical connector, and the second conductive layer may be coupled to a second electrical connector. Using different layers of a multi-layer PCB to couple the contacts of the first power semiconductor die and the second power semiconductor die allows the respective conductive layers to be wider than would otherwise be possible if the first conductive layer and the second conductive layer were adjacent to one another on a single layer PCB (for a PCB having the same width). Accordingly, the inductance from the first electrical connector to the first contacts of the first power semiconductor die and the second power semiconductor die and from the second electrical connector to the second contacts of the first power semiconductor die and the second power semiconductor die is reduced, thereby improving the performance of the power module.

In one embodiment, the first contact of the first power semiconductor die and the second power semiconductor die is a gate contact, and the second contact of the first power semiconductor die and the second power semiconductor die is a source contact such that the conductive path between the first electrical connector and the second electrical connector defines a gate control loop. The inductance of the gate control loop may be less than about 15 nH in some embodiments, and as low as about 1 nH. Reducing the inductance of the gate control loop in turn reduces interference and losses in the power module, thereby improving the performance thereof.

In one embodiment, the first electrical connector and the second electrical connector are provided together in a micro coaxial (MCX) connector. Providing the first electrical connector and the second electrical connector in an MCX connector reduces inductance and interference between an external connector and the respective electrical connectors, thereby further improving the performance of the power module.

In one embodiment, a plurality of power semiconductor die are coupled in series between a third electrical connector and a fourth electrical connector. The third electrical connector and the fourth electrical connector are wide bolted connectors, such that the electrical path between the third electrical connector and the fourth electrical connector has an inductance less than about 20 nH, and as low as about 1 nH. In other embodiments, the electrical path between the third electrical connector and the fourth electrical connector may be lower than about 16.5 nH.

In one embodiment, each one of the power semiconductor die uses an internal body diode thereof as an anti-parallel diode. Using an internal body diode for the anti-parallel diode of each power semiconductor die may reduce the size of each device and therefore allow for a reduction in the footprint of the power module or for additional power semiconductor die to be provided in the power semiconductor die.

In one embodiment, the power module may be rated to block between 6.5 kV and 16 kV and conduct up to 240 A with an on-state resistance around between 250 mΩ and 450 mΩ.

In one embodiment, a lid of the power module includes a number of openings through which the electrical connectors extend. At least one of the openings is surrounded by a creepage extender, which includes a number of concentric depressions and/or ridges. The creepage extender effectively extends a creepage distance between each one of the connectors such that the power module meets UL 840 and IEC 60664-1 creepage/clearance for a 15 kV module with a footprint of 195 mm×125 mm×23.5 mm.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 6A-6C show a creepage extender according to one embodiment of the present disclosure.

DETAILED DESCRIPTION

Figure 1:
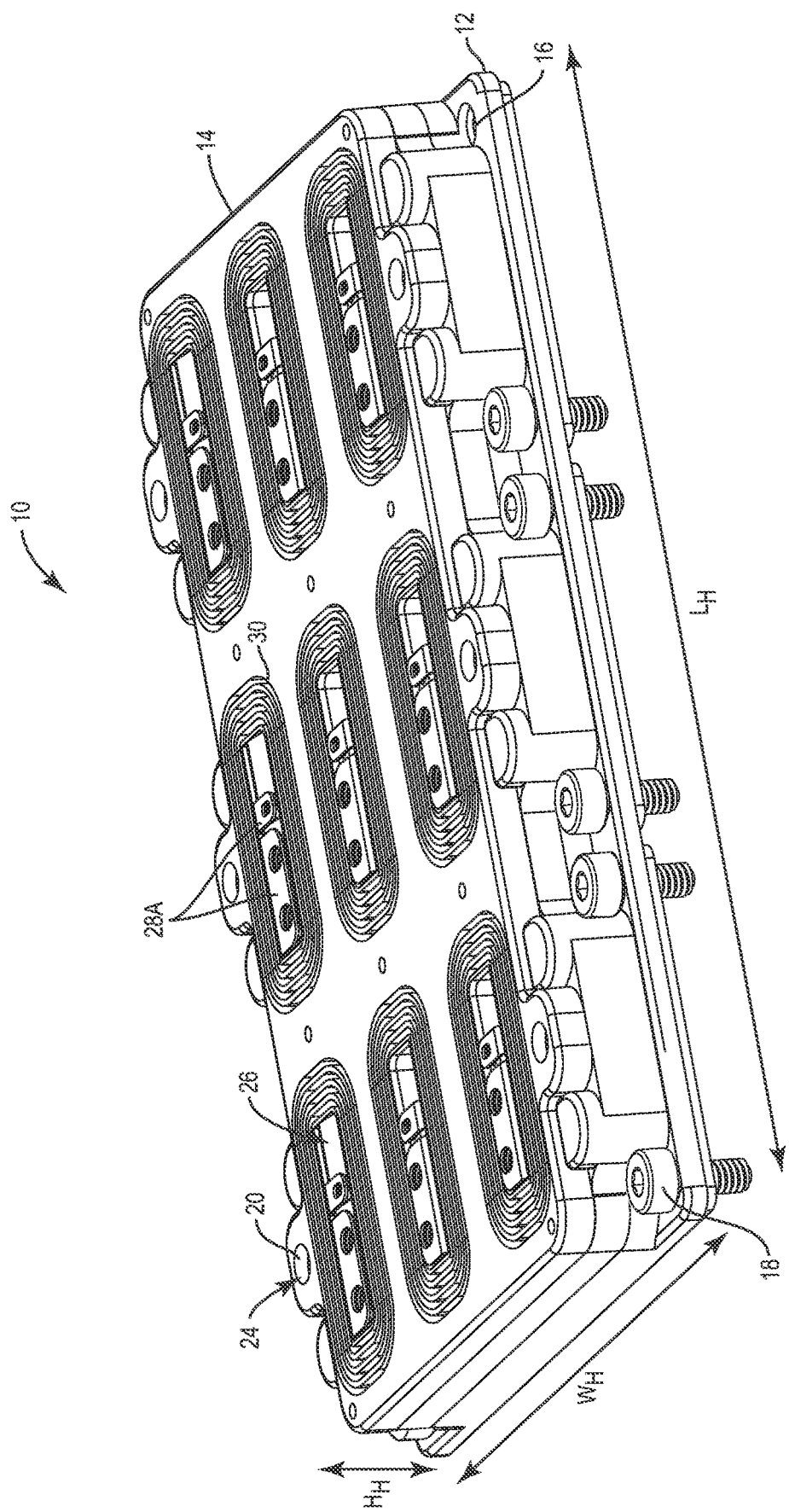
FIG. 1 shows an isometric view of a power module according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
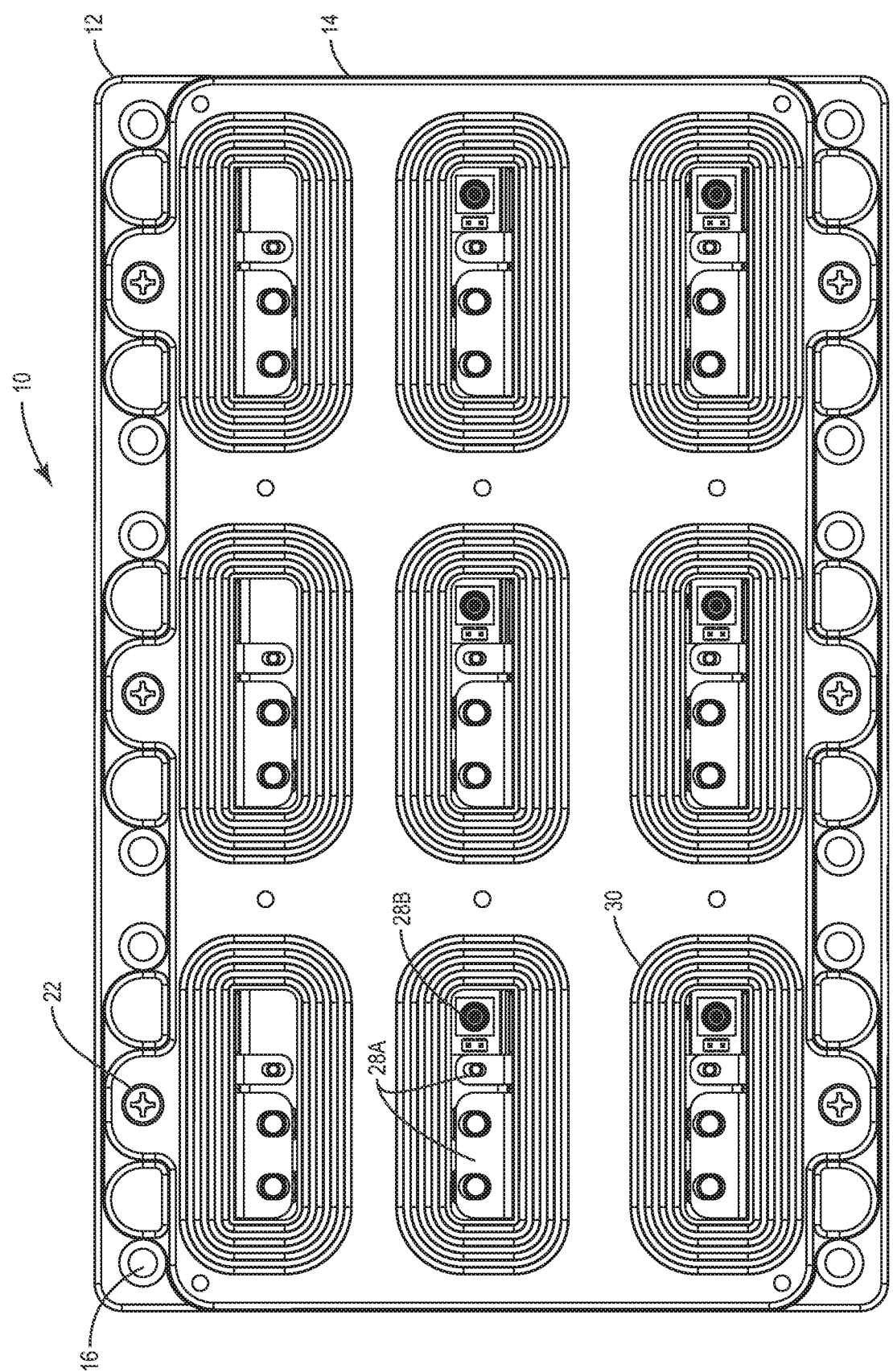
FIG. 2 shows a top view of a power module according to one embodiment of the present disclosure.

FIGS. 1 and 2 illustrate a power module 10 according to one embodiment of the present disclosure. Specifically, FIG. 1 shows an isometric view of the power module 10, while FIG. 2 shows a top view of the power module 10. While the parts of the power module 10 discussed below may be duplicated one or more times, identical parts may only be labeled once or twice in order to avoid cluttering and therefore confusing the drawings. The power module 10 includes a housing 12 and a lid 14. The housing 12 includes a number of mounting openings 16 through which mounting fasteners 18 can be provided in order to mount the power module 10 in a power converter system (not shown). Further, the housing 12 includes a number of threaded apertures 20 each configured to accept a lid-mounting fastener 22 in order to secure the lid 14 to the housing 12. The lid 14 includes a number of lid-mounting openings 24 corresponding with the threaded apertures 20 in the housing 12, such that the lid-mounting fasteners 22 pass through the lid-mounting openings 24 and are secured into the threaded apertures 20 in order to secure the lid 14 to the housing 12.

The lid 14 further includes a number of connector openings 26 through which one or more electrical connectors 28 (shown separately as 28A and 28B) from power converter circuitry (not shown) within the housing 12 are provided. Notably, each one of the connector openings 26 is surrounded by a creepage extender 30, which includes a number of raised and/or depressed concentric rings in the lid 14. Creepage is measured along the surface of the lid 14, as discussed in detail below. The creepage extender 30 surrounding each connector opening 26 effectively increases this distance without moving the electrical connectors 28 further apart. Accordingly, the overall footprint of the power module 10 can be reduced while maintaining desired creepage distances. While not shown, in some embodiments a creepage extender may also be provided around the outer edge of the lid 14. The creepage extenders may provide the power module 10 with a 15 kV rating according to UL 840 and IEC 60664-1 creepage/clearance requirements, while maintaining a relatively small footprint.

The housing 12 is defined by a housing length $L_H$, a housing width $W_H$, and a housing height $H_H$. The housing length $L_H$ may be about 195 mm, the housing width $W_H$ may be about 125 mm, and the housing height $H_H$ may be about 23.5 mm in some embodiments. Accordingly, the housing 12 may be configured to mount to a 3× EconoDUAL footprint coldplate. The housing 12 and the lid 14 may be plastic in some embodiments, however, the housing 12 and the lid 14 may be any suitable material without departing from the principles of the present disclosure.

The electrical connectors 28 may include a number of bolted connectors 28A and a number of low-noise connectors 28B. The bolted connectors 28A may be used for high voltage and/or high current connections to power converter circuitry (not shown) within the housing 12. The low-noise connectors 28B may be micro-coaxial (MCX) connectors, and may be used for low voltage and/or low current connections to control nodes in power converter circuitry (not shown) within the housing 12.

Figure 3:
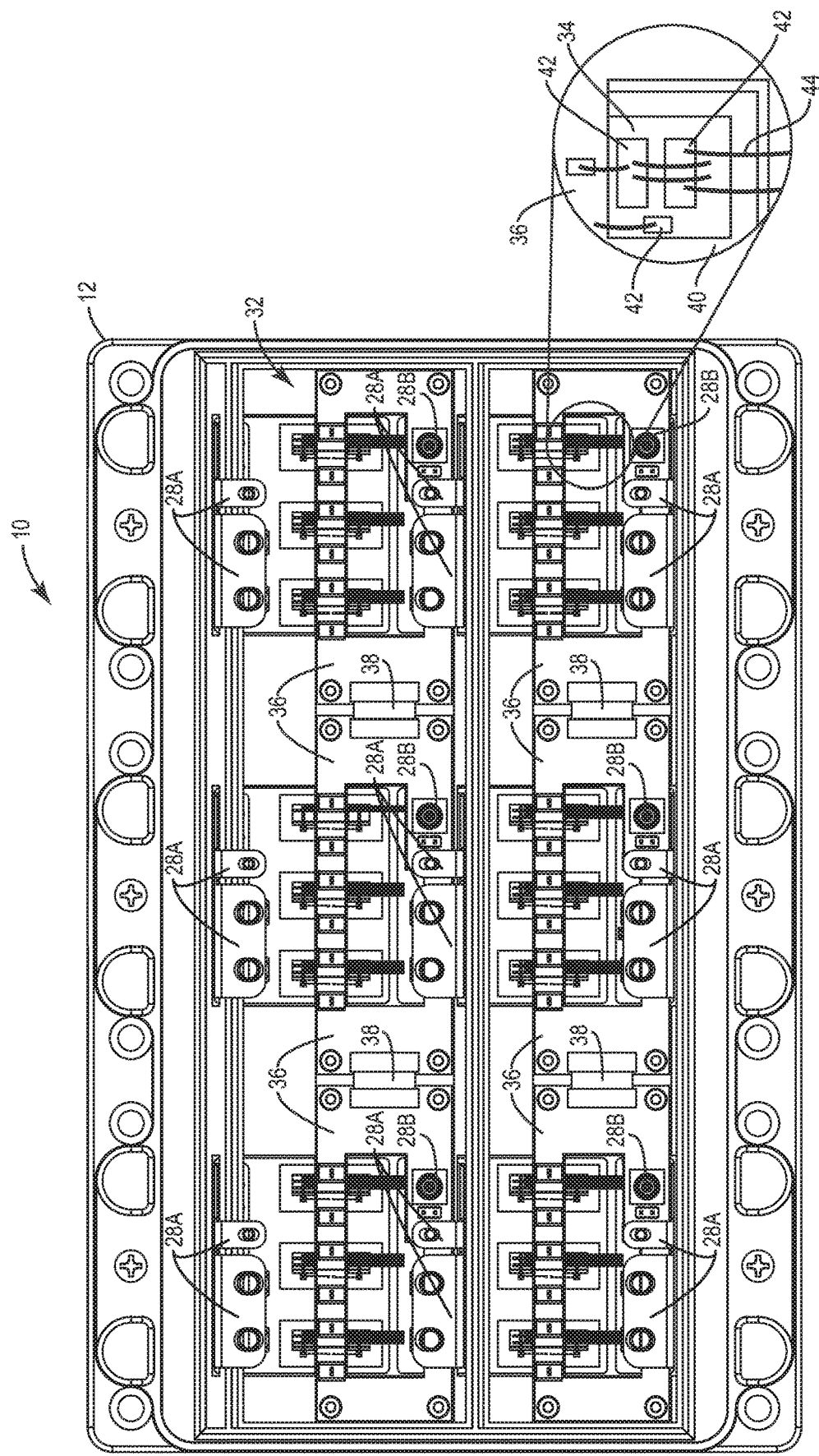
FIG. 3 shows a top view of power converter circuitry within a power module according to one embodiment of the present disclosure.

FIG. 3 shows details of power converter circuitry 32 within the housing 12 according to one embodiment of the present disclosure. The power converter circuitry 32 includes a number of power semiconductor die 34, a number of interconnect printed circuit boards (PCBs) 36, and a number of removable jumpers 38 coupled between the interconnect PCBs 36. Each one of the power semiconductor die 34 are mounted to a power substrate 40 and include a number of contact pads 42 on the top side thereof for electrically connecting to the power semiconductor die 34. Wire bonds 44 connect the various contact pads 42 of each power semiconductor die 34 to a desired connection point. In one embodiment, each one of the power semiconductor die 34 is a metal-oxide-semiconductor field-effect transistor (MOSFET) such that the contact pads 42 include a gate contact, a drain contact, and a source contact (not shown). In other embodiments, each one of the power semiconductor die 34 may be an insulated gate bipolar transistor (IGBT). The drain contact and the source contact of each one of the power semiconductor die 34 are coupled to one of the bolted connectors 28A, which extend through the lid as discussed above and provide the connection points for the high voltage and/or high current switching path provided by the power semiconductor die 34. The gate contact and the source contact of each one of the power semiconductor die 34 are coupled to one of the low-noise connectors 28B via one of the interconnect PCBs 36. Specifically, the gate contact of each one of the power semiconductor die 34 is coupled to a first connection point in one of the low-noise connectors 28B, while the source contact of each one of the power semiconductor die 34 is coupled to a second connection point of the same one of the low-noise connectors 28B, which is isolated from the first connection point. The low-noise connectors 28B provide the connection points for low voltage and/or low current control signals to be provided to the power semiconductor die 34.

Figure 4:
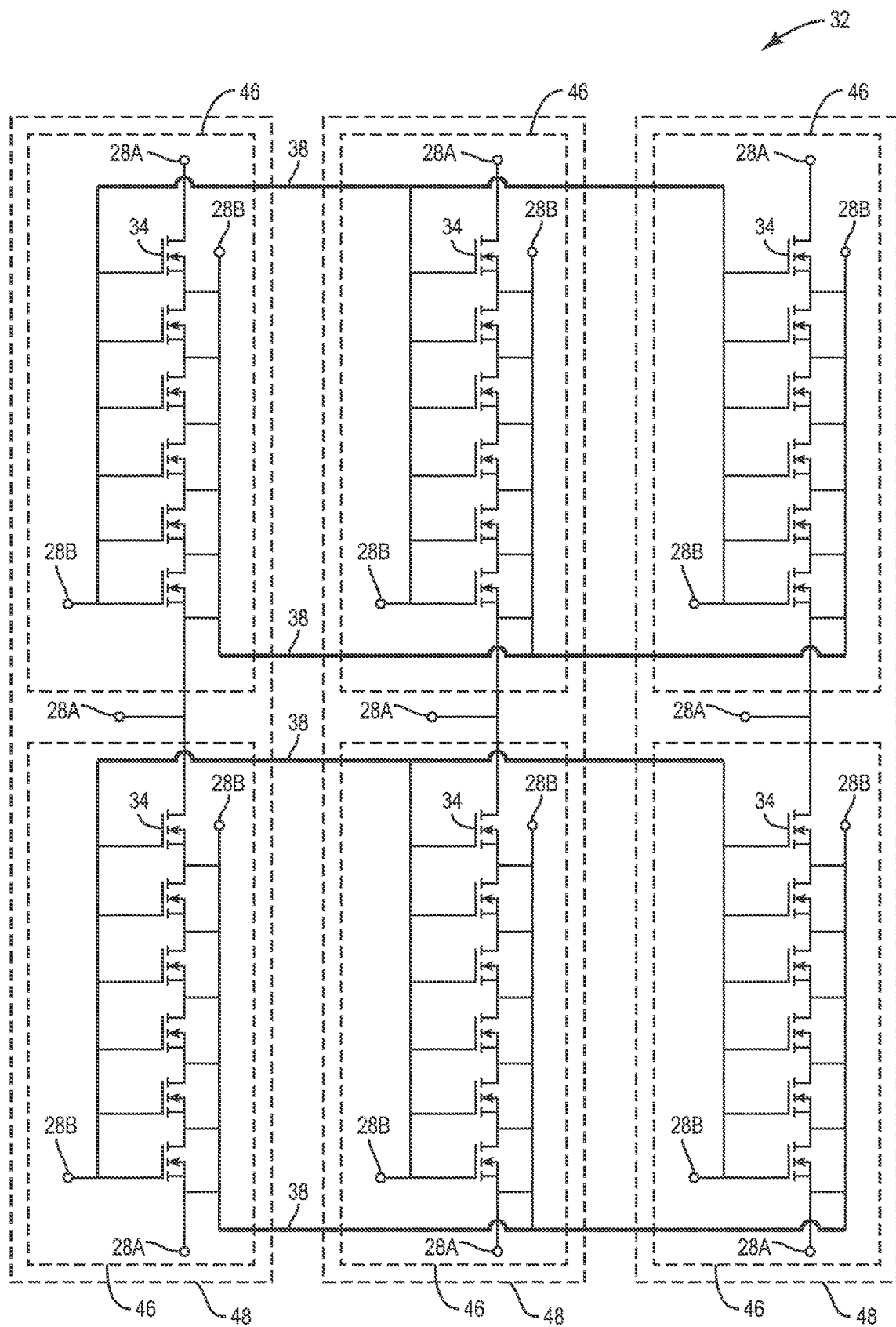
FIG. 4 shows a schematic view of power converter circuitry within a power module according to one embodiment of the present disclosure.

The power semiconductor die 34 may be arranged in groups 46 as further illustrated in FIG. 4. Each group 46 may include six power semiconductor die 34 coupled in series in order to distribute a voltage provided across the group 46 and therefore increase the voltage handling capability thereof. Each group 46 may be paired with another group to form a sub-module 48. Each paired group 46 may similarly be connected in series such that each sub-module 48 includes twelve power semiconductor die 34 coupled in series. Accordingly, a first row of the bolted connectors 28A may provide a connection to a drain of a first one of the power semiconductor die 34 in a respective sub-module 48, a second row of the bolted connectors 28A may provide a connection to drain-source connection between a first group 46 and a second group 46 in a respective sub-module 48, and a third row of the bolted connectors 28A may provide a connection to a source connection of a last one of the power semiconductor die 34 in a respective sub-module 48. The gate-source control connections for each power semiconductor die 34 in the respective groups 46 may be coupled together via a respective interconnect PCB 36. The gate-source connections between various ones of the groups 46 may be coupled together by the removable jumpers 38. While not shown, a gate return or source sense connection is generally provided to each one of the source connections of the power semiconductor die 34, and a desaturation connection is generally provided to protect against severe low impedance short circuits.

While the removable jumpers 38 for the gate connection and the source connection of each group 46 are shown separately in FIG. 4, they are generally provided together in a single removable jumper 38 as shown in FIG. 3. However, the removable jumpers 38 may be provided in any desired configuration without departing from the principles of the present disclosure. Further, while the low-noise connectors 28B are shown separately for the gate and source connections of the power semiconductor die 34, the low-noise connectors 28B may be provided together as MCX connectors as discussed above.

Using the removable jumpers 38 allows the power module 10 to be flexibly reconfigured and tested. When the removable jumpers 38 are provided, the gate contacts and the source contacts of a subset of the power semiconductor die 34 are coupled together. Specifically, the eighteen power semiconductor die 34 located in the top portion of the power module 10 are coupled together via their gate contacts and the source contacts to form a first portion of a switching leg, while the eighteen power semiconductor die 34 located in the bottom portion of the power module 10 are coupled together via their gate contacts and the source contacts to form a second portion of the switching leg. When the removable jumpers 38 are provided, each row of bolted connectors 28A will generally be coupled together such that each sub-module 48 is coupled in parallel. This effectively creates a high voltage and high current switching leg including two very large switching devices in series that may be used in high performance power converter systems. Such a configuration may be used, for example, in a single-phase power converter system. Specifically, the power module 10 may be used as a half-bridge power module when the removable jumpers 38 are provided. In such a configuration, the power module 10 may provide 10 kV of blocking capability and 240 A of forward conduction. The power semiconductor die 34 may be 10 kV MOSFETs with a 350 mΩ on-state resistance, such as model number CPM3-10000-0350-ES manufactured by Cree, Inc. of Durham, N.C., the data sheet of which is hereby incorporated by reference in its entirety. In an additional embodiment, the power semiconductor die 34 may be 10 kV IGBTs such as those manufactured by Cree, Inc. of Durham, N.C.

While the embodiments herein are primarily discussed as they relate to 10 kV parts, any suitable parts may be used without departing from the principles of the present disclosure. For example, 5 kV parts, 15 kV parts, or the like, may similarly be used.

When the removable jumpers 38 are not provided, each sub-module 48 is allowed to operate independently of the other. That is, a control signal provided to a low-noise connector 28B associated with a particular group 46 of the power semiconductor die 34 may not be provided to the power semiconductor die 34 in other groups 46. Such a configuration may be useful for individually testing the separate sub-modules 48 or operating the power module 10 in a three-phase power converter system in which each one of the sub-modules 48 is independently controlled. In one embodiment, each one of the sub-modules 48 is separately removable from the power module 10. Accordingly, independently testing and replacing a single sub-module 48 is possible, thereby allowing the power module 10 to be repaired.

While the power module 10 is shown and discussed above with respect to a particular number of power semiconductor die 34 and particular power handling capabilities, the present disclosure is not so limited. That is, the concepts of the present disclosure may be applied to power modules having any number of power semiconductor die and providing different power handling capabilities. For example, instead of eighteen power semiconductor die 34 in the top portion and the bottom portion of the power module 10, any number of power semiconductor die 34 such as thirty-two, twenty-four, nine, six, or three power semiconductor die 34 may be used without departing from the principles of the present disclosure.

Notably, the interconnect PCBs 36 may be multi-layer PCBs in which the connections between the gate contacts of the power semiconductor die 34 are provided on a first conductive layer and the connections between the source contacts of the power semiconductor die 34 are provided on a second conductive layer. This allows the lateral width of the connective paths to be increased compared to conventional approaches without increasing the width of the interconnect PCBs 36. That is, if the connections between the gate contacts of the power semiconductor die 34 and the connections between the source contacts of the power semiconductor die 34 were provided on the same conductive layer (i.e., in the same plane) as in conventional approaches, they would have to share the surface area of this layer, thereby reducing the overall width of the conductive paths and resulting in increased resistance and parasitic inductance. Due to the use of a multi-layer PCB, the parasitic inductance between the gate contacts, the source contacts, and the low-noise connectors 28B is significantly reduced, which in turn increases the performance of the power module 10. In one embodiment, a gate control loop is defined as the electrical path between the first connection point and the second connection point of one of the low-noise connectors 28B. Due to the use of multi-layer interconnect PCBs 36 and the proximity of the connections on the interconnect PCBs 36 to the power semiconductor die 34, the inductance of the gate control loop may be reduced when compared to conventional power modules, and generally may be less than 15 nH, and specifically around 10 nH. In one embodiment, the inductance of the gate control loop may be greater than about 1 nH. In various embodiments, the inductance of the gate control loop may be between about 10 nH and 15 nH, between about 5 nH and 10 nH, and between about 1 nH and 5 nH.

The relatively large width of the bolted connectors 28A and their proximity to the power semiconductor die 34 may allow for similar reductions in the inductance of the high voltage/high current path of the power module 10. Specifically, the electrical path between the drain contact of a first one of the power semiconductor die 34 and a source contact of a last one of the power semiconductor die 34 (or between the first row of bolted connectors 28A and the last row of bolted connectors 28A) may have an inductance less than 20 nH, and specifically around 16 nH. In one embodiment, the inductance of the electrical path between the drain contact of a first one of the power semiconductor die 34 and a source contact of a last one of the power semiconductor die 34 is greater than about 1 nH. In various embodiments, the inductance of the electrical path between the drain contact of a first one of the power semiconductor die 34 and a source contact of a last one of the power semiconductor die 34 is between about 10 nH and 16 nH, between about 8 nH and 12 nH, and between about 6 nH and 10 nH. In one embodiment, the width of the bolted connectors 28A is between about 15 mm and 80 mm, which reduces the inductance of the power loop as discussed above. In other embodiments, the width of the bolted connectors 28A may be between about 30 mm and 50 mm and 40 mm and 60 mm.

As shown in FIG. 4, the power semiconductor die 34 do not include an anti-parallel Schottky diode as in many conventional power modules. This is because the internal body diode of the power semiconductor die 34 is used. Using the internal body diode of the power semiconductor die 34 as the anti-parallel diode significantly reduces the size of the power semiconductor die 34 and thus the overall footprint of the power module 10. This may allow additional power semiconductor die 34 to fit within the power module, thereby increasing the power handling capability thereof.

Figure 5:
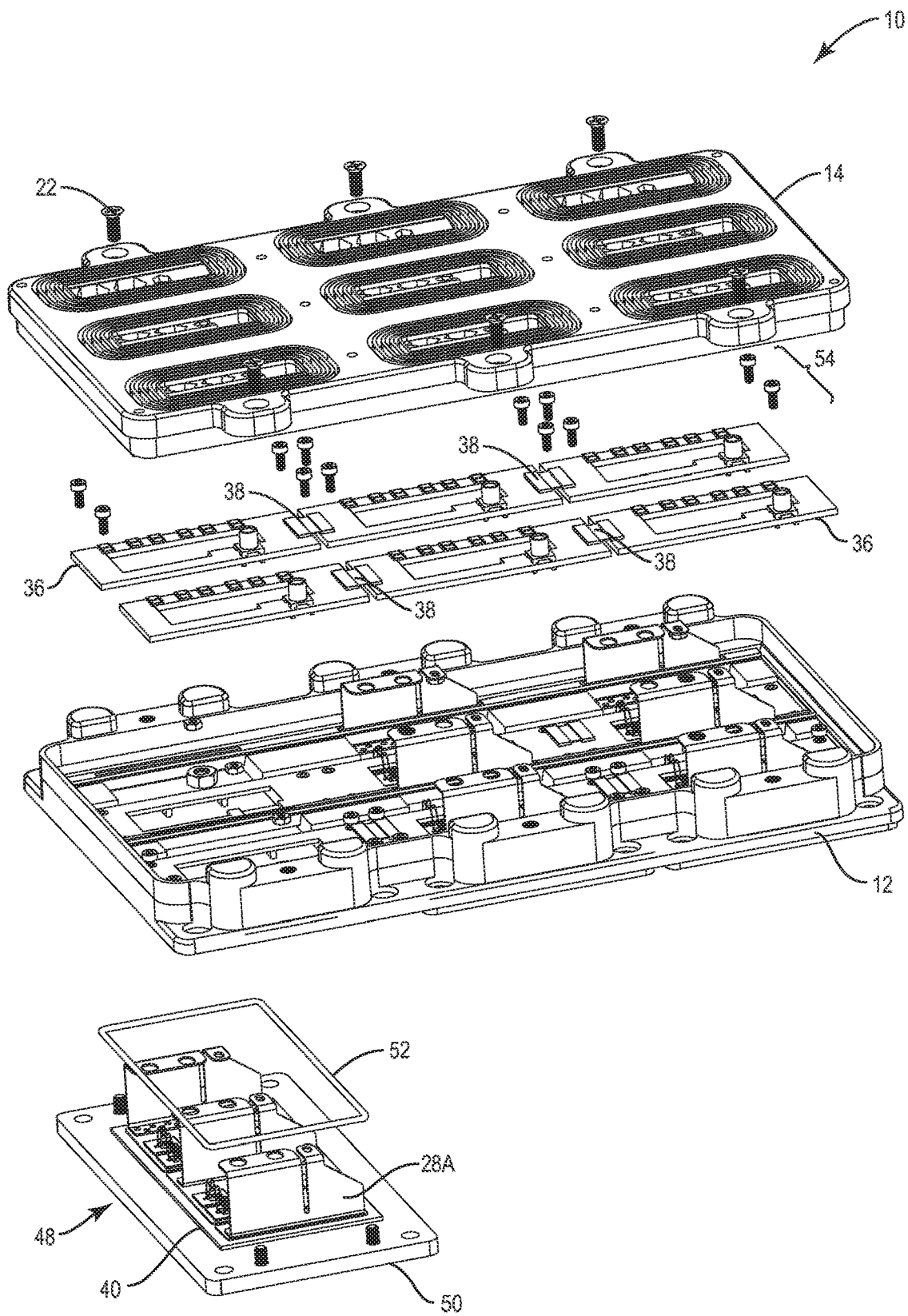
FIG. 5 shows an exploded view of a power module according to one embodiment of the present disclosure.

FIG. 5 shows an exploded view of the power module 10 according to one embodiment of the present disclosure. While the details of the power module 10 remain the same as those discussed above, FIG. 5 shows a particular sub-module 48 being removed from the power module 10. As shown, the bolted connectors 28A are coupled to the power substrate 40 and extend through a number of openings provided in the housing 12. The power substrate 40 is in turn located on top of a baseplate 50. A gasket 52 surrounds the sub-module 48 and seals it against the housing 12 so that an insulating potting material such as silicone, or a dielectric fluid, is sealed inside the housing 12. This may save time in sealing the sub-modules 48 when compared to a conventional epoxy process that requires curing before potting. A number of interconnect PCB connectors 54 hold the interconnect PCBs 36 in place as shown. The power substrate 40, the baseplate 50, and the particular layout of each sub-module 48 allow for a thermal resistance ($R_{jc}$) less than about 0.026° C./W per switch position when the module is used in a half-bridge configuration.

Notably, using the sub-modules 48 in the power module 10 allows each sub-module 48 to be independently replaced. Accordingly, failure of a single or even multiple power semiconductor die 34 in a single sub-module 48 does not facilitate replacement of the entire power module 10 as in conventional modules. Since the power semiconductor die 34 may be expensive, this may result in significant cost savings when compared to conventional approaches.

Figure 6A:
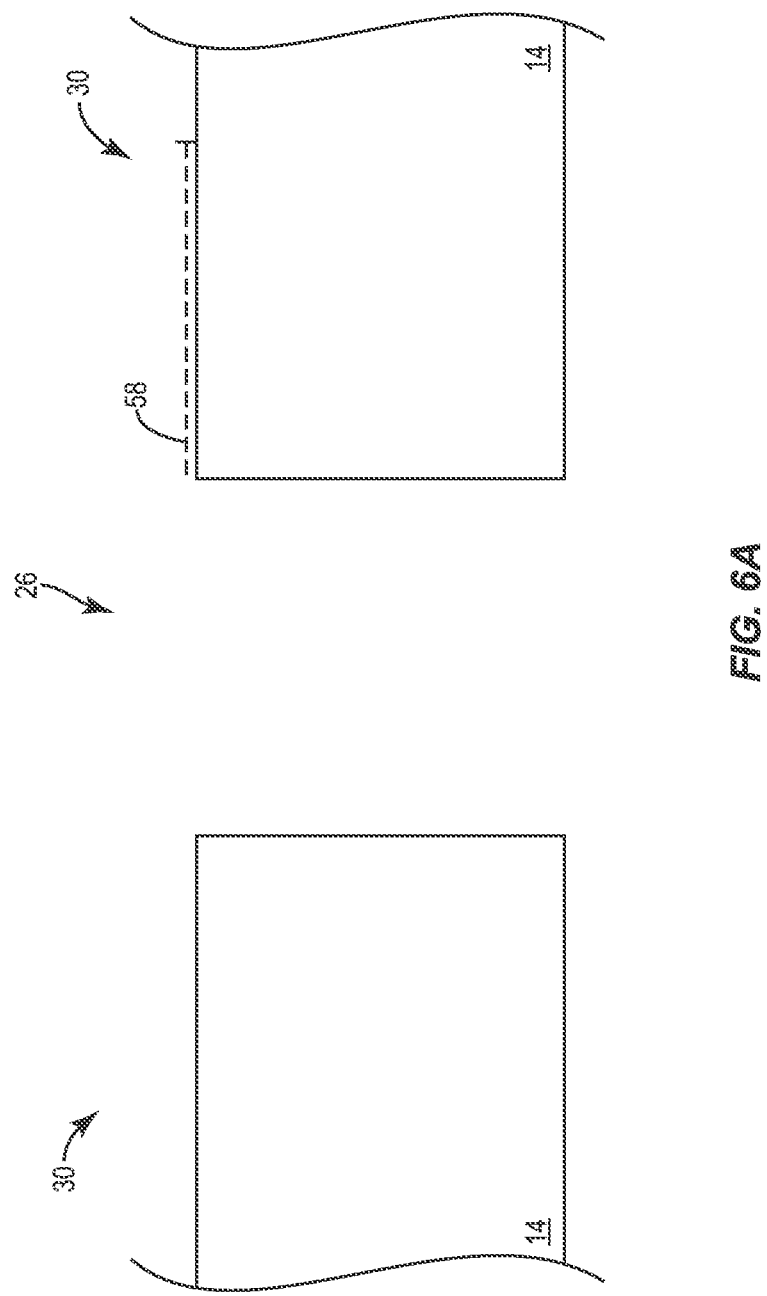

FIGS. 6A through 6C show details of a connector opening 26 according to various embodiments of the present disclosure. Specifically, FIGS. 6A through 6C show cross-sectional views of the connector opening 26. As shown in FIG. 6A, a conventional connector opening 26 includes no creepage extender. FIG. 6B illustrates a creepage extender 30 including a number of concentric depressions 56 surrounding one of the connector openings 26. The same result can be achieved with a number of concentric raised ridges, as shown in FIG. 6C. As illustrated by a first dashed line 58 in FIG. 6A and a second dashed line 60 in FIGS. 6B and 6C, a creepage measurement along a flat surface of a conventional lid 14 is significantly shorter than the creepage measurement along the creepage extender 30. Accordingly, the creepage extender 30 allows for an increase in creepage distance without moving connectors or otherwise altering the footprint of the power module 10.

Figure 7:
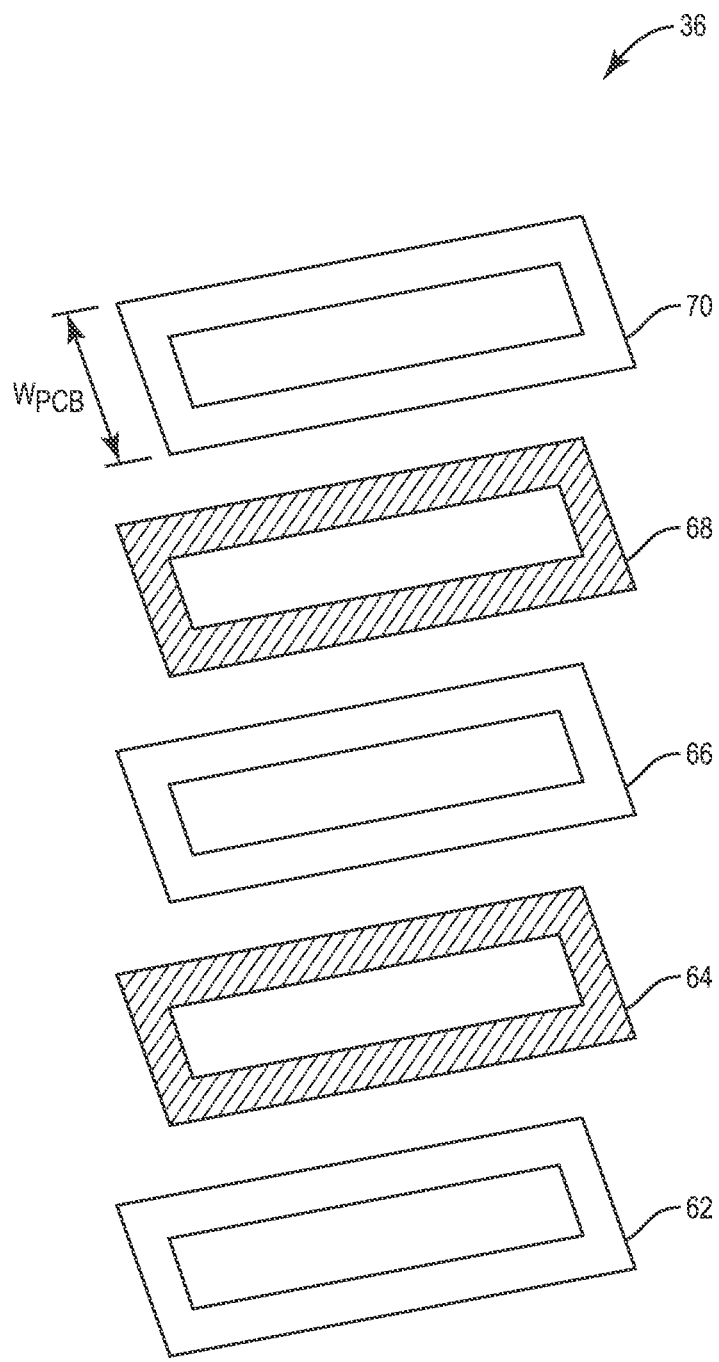
FIG. 7 shows a multi-layer printed circuit board (PCB) according to one embodiment of the present disclosure.

FIG. 7 shows details of one of the interconnect PCBs 36 according to one embodiment of the present disclosure. Specifically, FIG. 7 shows an exploded view of one of the interconnect PCBs 36. As shown, the interconnect PCB 36 includes a first insulating layer 62, a first conductive layer 64 over the first insulating layer 62, a second insulating layer 66 over the first conductive layer 64, a second conductive layer 68 over the second insulating layer 66, and a third insulating layer 70 over the second conductive layer 68. Notably, using a multi-layer structure as shown allows the first conductive layer 64 and the second conductive layer 68 to span the width $W_{PCB}$ of the interconnect PCB 36. This would not be possible if the conductive layers were provided on the same plane, as they would then have to share the surface area of that plane. Accordingly, the width of the interconnect PCB 36 can be maintained at a reasonable value while providing a low inductance pathway for connection within the interconnect PCB 36. A number of vias (not shown) connect to the first conductive layer 64 and the second conductive layer 68 to provide contact, for example, with one of the low-noise connectors 28B, the removable jumpers 38, or any other desired component. While a particular number and configuration of layers are shown in the interconnect PCB 36, any number of layers may be included in the interconnect PCB 36 and arranged in any configuration without departing from the principles of the present disclosure. In one embodiment, the width $W_{PCB}$ of the interconnect PCB 36 is between about 15 mm and 80 mm to reduce resistance and parasitic inductance of the first conductive layer 64 and the second conductive layer 68.

Those skilled in the art will recognize improvements and modifications to the preferred embodiments of the present disclosure. All such improvements and modifications are considered within the scope of the concepts disclosed herein and the claims that follow.

What is claimed is:

1. A power module, comprising:
   a plurality of electrical connectors; and
   a plurality of power semiconductor die, wherein a gate contact and a source contact of a first power semiconductor die of the plurality of power semiconductor die are electrically connected to form a gate control loop comprising an inductance that is less than about 15 nH.

2. The power module of claim 1, wherein the power module is configured to block at least 3 kV.

3. The power module of claim 1, wherein the power module is configured to block between about 5 kV and 16 kV.

4. The power module of claim 1, wherein the inductance of the gate control loop is greater than about 1 nH and less than about 15 nH.

5. The power module of claim 1, wherein the inductance of the gate control loop is between about 10 nH and 15 nH.

6. The power module of claim 1, wherein the inductance of the gate control loop is between about 5 nH and 10 nH.

7. The power module of claim 1, wherein the inductance of the gate control loop is between about 1 nH and 5 nH.

8. The power module of claim 1, wherein the gate contact and the source contact of the first power semiconductor die are electrically connected to different connection points of a first electrical connector of the plurality of electrical connectors.

9. The power module of claim 8, further comprising a multi-layer printed circuit board that is configured to electrically connect the gate contact and the source contact of the first semiconductor die to the different connection points of the first electrical connector.

10. The power module of claim 9, wherein the multi-layer printed circuit board comprises a first conductive layer that is configured to provide an electrical connection between the gate contact and the first electrical connector and a second conductive layer that is configured to provide an electrical connection between the source contact and the first electrical connector.

11. The power module of claim 10, wherein the first conductive layer and the second conductive layer are separated by an insulating layer of the multi-layer printed circuit board.

12. The power module of claim 10, wherein the first conductive layer and the second conductive layer are configured to span a width of the multi-layer printed circuit board.

13. The power module of claim 12, wherein the width of the multi-layer printed circuit board is between about 15 mm and 80 mm.

14. The power module of claim 8, wherein the first electrical connector comprises a low noise connector.

15. The power module of claim 14, wherein the low noise connector comprises a micro-coaxial connector.

16. The power module of claim 8, further comprising a lid that forms a connector opening and the first electrical connector is provided through the connector opening, wherein the connector opening comprises a creepage extender that forms at least one concentric depression.

17. The power module of claim 1, wherein the plurality of power semiconductor die comprise a plurality of metal-oxide-semiconductor field-effect transistors (MOSFETs).

18. The power module of claim 1, wherein the plurality of power semiconductor die form a first sub-module of a number of sub-modules.

19. A power module, comprising:
a plurality of power semiconductor die coupled in series, wherein the plurality of power semiconductor die comprise a number of power semiconductor die coupled between a first power semiconductor die and a last power semiconductor die;
wherein an electrical path between a drain contact of the first power semiconductor die and a source contact of the last power semiconductor die comprises a power loop inductance that is less than about 20 nH.

20. The power module of claim 19, wherein the power module is configured to block at least 3 kV.

21. The power module of claim 19, wherein the power module is configured to block between about 5 kV and 16 kV.

22. The power module of claim 19, wherein the power loop inductance is greater than about 1 nH and less than about 20 nH.

23. The power module of claim 19, wherein the power loop inductance is between about 10 nH and 16 nH.

24. The power module of claim 19, wherein the power loop inductance is between about 8 nH and 12 nH.

25. The power module of claim 19, wherein the power loop inductance is between about 6 nH and 10 nH.

26. The power module of claim 19, further comprising a first electrical connector coupled to the drain contact of the first power semiconductor die and a second electrical connector coupled to the source contact of the last power semiconductor die.

27. The power module of claim 26, wherein the first electrical connector and the second electrical connector comprise bolted connectors.

28. The power module of claim 27, wherein a width of the bolted connectors is between about 15 mm and 80 mm.

29. The power module of claim 26, further comprising a lid that forms a connector opening and the first electrical connector is provided through the connector opening, wherein the connector opening comprises a creepage extender that forms at least one concentric depression.

30. The power module of claim 19, wherein the plurality of power semiconductor die comprise a plurality of metal-oxide-semiconductor field-effect transistors (MOSFETs).

31. The power module of claim 19, wherein the plurality of power semiconductor die form a first sub-module of a number of sub-modules.

* * * * *